United States Patent
Nemesh et al.

(10) Patent No.: US 8,174,831 B2
(45) Date of Patent: May 8, 2012

(54) HEATING CIRCUIT AND ELECTRONICS ASSEMBLY

(75) Inventors: Mark D. Nemesh, Troy, MI (US); Franz Bohlender, Kandel (DE)

(73) Assignee: GM Global Technology Operations LLC, Detroit, MI (US)

( * ) Notice: Subject to any disclaimer, the term of this patent is extended or adjusted under 35 U.S.C. 154(b) by 139 days.

(21) Appl. No.: 12/839,453

(22) Filed: Jul. 20, 2010

(65) Prior Publication Data

US 2012/0020023 A1   Jan. 26, 2012

(51) Int. Cl.
*H05K 7/20* (2006.01)

(52) U.S. Cl. ... 361/699; 361/701; 165/80.4; 165/104.33

(58) Field of Classification Search .................. None
See application file for complete search history.

(56) References Cited

U.S. PATENT DOCUMENTS

| | | | | |
|---|---|---|---|---|
| 5,966,291 A | * | 10/1999 | Baumel et al. | 361/707 |
| 7,579,805 B2 | * | 8/2009 | Saito et al. | 318/800 |
| 7,710,721 B2 | * | 5/2010 | Matsuo et al. | 361/699 |
| 7,760,503 B2 | * | 7/2010 | Aoki et al. | 361/699 |
| 7,969,735 B2 | * | 6/2011 | Nakatsu et al. | 361/699 |
| 2005/0128706 A1 | * | 6/2005 | Maly et al. | 361/699 |
| 2009/0040724 A1 | * | 2/2009 | Nishikimi et al. | 361/699 |
| 2011/0228478 A1 | * | 9/2011 | Takata et al. | 361/699 |

* cited by examiner

*Primary Examiner* — Boris Chervinsky

(57) ABSTRACT

A heating circuit and an electronics assembly for use in a vehicle includes an external housing having outer walls and an internal wall dividing the external housing into an electronics cavity and a non-electronics cavity. A heat generating electronics assembly is located in the electronics cavity adjacent to the internal wall. A control electronics assembly is located in the electronics cavity adjacent to the heat generating electronics assembly, with the control electronics portion controlling the heat generating electronics assembly; and an internal heat shield extending between and shielding the control electronics assembly from the heat generating electronics assembly, with the internal heat shield being made of a thermally conductive material and having a contact portion attached to the internal wall, whereby heat absorbed by the internal heat shield transmitted to the internal wall.

12 Claims, 1 Drawing Sheet

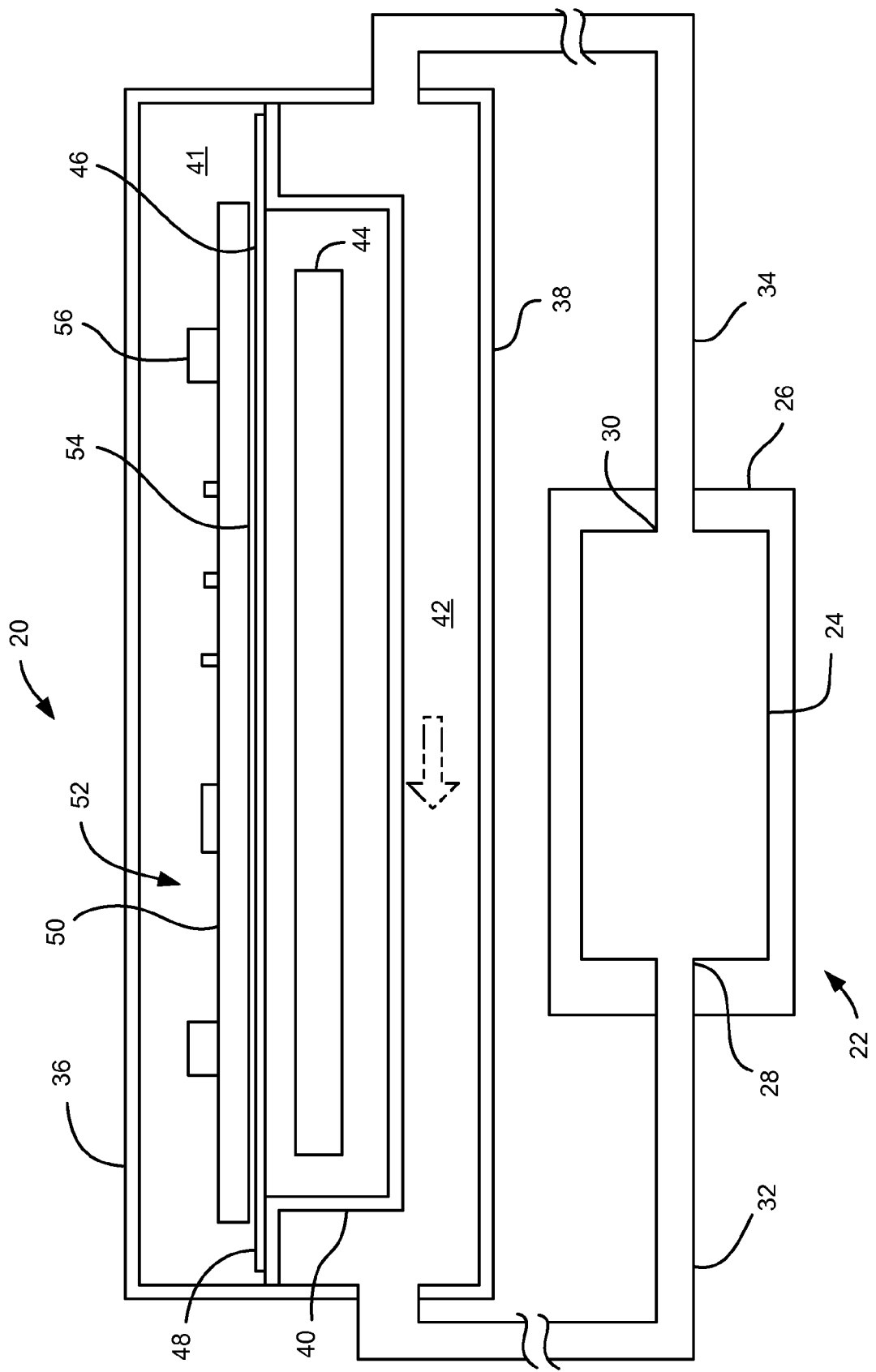

HEATING CIRCUIT AND ELECTRONICS ASSEMBLY

BACKGROUND OF INVENTION

The present invention relates generally to cooling of electronics use in automotive vehicles.

Some electronics employed in automotive vehicles give off a significant amount of heat. For some components, some form of cooling is required. In particular, extended range battery electric and hybrid electric vehicles employ high voltage electronics components that give off significant amounts of heat. For certain of these high voltage systems, the heat may cause undesirable effects for other adjacent electronics that are more heat sensitive. That is, some of the electronics may not be able to operate at elevated temperatures. Moving various electronics away from each other to avoid the heat may be impractical with the cost and packaging limitations inherent in modern automotive vehicles.

SUMMARY OF INVENTION

An embodiment contemplates a heating circuit and an electronics assembly for use in a vehicle comprising: an external housing having outer walls and an internal wall dividing the external housing into an electronics cavity and a non-electronics cavity, and a heat generating electronics assembly located in the electronics cavity adjacent to the internal wall. The embodiment also comprises a control electronics assembly located in the electronics cavity adjacent to the heat generating electronics assembly, with the control electronics portion controlling the heat generating electronics assembly; and an internal heat shield extending between and shielding the control electronics assembly from the heat generating electronics assembly, with the internal heat shield being made of a thermally conductive material and having a contact portion attached to at least one of the internal wall and the outer walls, whereby heat absorbed by the internal heat shield from the heat generating electronics assembly is transmitted to at least one of the internal wall and the outer walls.

An embodiment contemplates a method of operating a heating circuit and electronics assembly in a vehicle, the method comprising the steps of: providing an external housing having outer walls and an internal wall dividing the external housing into an electronics cavity and a fluid flow channel; directing a fluid through the fluid flow channel; controlling a cabin coolant heater, located in the electronics cavity, with a control electronics assembly, located in the electronics cavity adjacent to the cabin coolant heater, to cause heat transfer from the cabin coolant heater to the fluid flowing through the fluid flow channel; absorbing heat from the cabin coolant heater into a thermally conductive internal heat shield located between the cabin coolant heater and the control electronics assembly; and transferring heat from the internal heat shield to at least one of the outer walls and the internal wall.

An advantage of an embodiment is that a printed circuit board and electronics devices can be mounted in proximity to a heat generating electronic assembly, with an internal heat shield mounted between them blocking some of the heat from reaching the circuit board and devices. This may allow the solder on the board and the electronics devices to be designed for operation at lower temperatures, thus reducing the cost of the electronics. This also allows the control and the high heat generating electronics to be mounted in the same housing, thus minimizing packaging space taken in the vehicle and avoiding the need for additional high voltage electrical wiring and interlock electrical wiring (to sense when the high voltage electrical connectors are disconnected) in the vehicle.

BRIEF DESCRIPTION OF DRAWINGS

The FIGURE is a schematic drawing of a portion of a heating circuit and electronics assembly in a vehicle.

DETAILED DESCRIPTION

The FIGURE shows an electronics assembly 20 that may be used in a heating circuit 22 for a vehicle. The heating circuit 22 may include a heat exchanger 24, which may be, for example, a heater core in a vehicle heating, ventilation and air conditioning (HVAC) system 26. The heat exchanger 24 may have a fluid inlet 28 and a fluid outlet 30 through which a fluid, such as a liquid coolant, flows. The liquid coolant may be, for example, a mixture of water and ethylene glycol. Fluid lines 32 and 34, respectively, direct the fluid from and to the electronics assembly 20. The fluid lines 32 and 34 are shown broken in the FIGURE because they may also connect to other components of a heating circuit. For example, the fluid may also flow through an internal combustion engine, when operating, or through other vehicle components.

The electronics assembly 20 includes an external housing 36 to which the fluid lines 32, 34 may be connected. The external housing 36 includes outer walls 38 surrounding the assembly 20 and an internal wall 40 that, in combination with outer walls 38, defines a fluid flow channel (non-electronics cavity) 42 separated from an electronics cavity 41. The fluid flow channel 42 receives fluid from the fluid line 34 and directs fluid into the fluid line 32. The internal wall 40 is preferably formed of a thermally conductive material that easily transmits heat. The internal wall 40 also seals the fluid flow channel 42 from the electronics cavity 41 to keep the fluids away from the electronic components.

Adjacent to the internal wall 40 is a high heat generating electronics assembly 44, which may be, for example, a high voltage cabin coolant heater. Adjacent to the high heat generating electronics assembly 44 is an internal heat shield 46. The internal heat shield 46 is preferably formed of a thermally conductive material, such as, for example, aluminum, as opposed to a thermally insulating material. The heat shield 46 mounts to the internal wall 40 with overlap creating contact portions 48 conducive to heat transfer from the heat shield 46 to the internal wall 40. Alternatively, the heat shield 46 mounts to the outer walls 38 in a way conducive to transmitting heat from the heat shield 46 to the outer walls 38.

The heat generating electronics assembly 44, as defined herein, is an assembly where heat generation is not merely incidental to the operation of the assembly (as all electronics typically give off some amount of heat during operation), but one where a significant amount of heat is generated due to the nature of the high voltage and large amount of power consumed by the heat generating electronics assembly 44. In the present example, the high heat generating electronics assembly 44 may be a high voltage cabin coolant heater, or a portion thereof, whose only purpose is to generate large amounts of heat, and may include, for example, a heat generating element and contact board.

A printed circuit board 50 that forms part of a control electronics assembly 52 is located adjacent to but spaced from the heat shield 46 to form a gap 54 between them. Various electronic devices 56 used for controlling the electronics assembly 20 may be mounted on the board 50 by, for example, soldering. The types of devices 56 are known to those skilled in the art and so will not be discussed further herein.

The printed circuit board 50 is located close to the heat generating electronics assembly 44 in order to integrate the control electronics assembly 52 into the same housing 36 as the electronic assembly 44 and keep the size of the housing 36 to a minimum. This may improve overall vehicle packaging as well as minimize the number of housings while also avoiding the need for additional high voltage electrical wiring and interlock electrical wiring (to sense when the high voltage electrical connectors are disconnected) in the vehicle.

The operation of the electronics assembly 20 and heating circuit 22 will now be discussed. This vehicle may operate at times with an internal combustion engine (or other power plant, not shown) turned off. In such a situation, if windshield defrosting or passenger compartment heating is requested, then the heat is provided by the electronics assembly 20 in conjunction with the heating circuit 22. The control electronics assembly 52 activates the heat generating electronics assembly 44 (in this example a high voltage cabin coolant heater) and the fluid (in this example a liquid coolant, such as an engine coolant) is pumped through the fluid flow channel 42. As the fluid flows through the channel 42 it absorbs heat from the electronics assembly 44 and then is directed through the fluid line 32 to the heat exchanger 24 (in this example a heater core in an HVAC system). Air may be directed through the heat exchanger 24, absorbing heat from the fluid, which is then directed into the passenger compartment. The fluid is then directed through fluid line 34 back to the fluid flow channel 42.

During this heating operation, the heat generating electronics assembly 44 gives off a great deal of heat, some of which radiates in the direction of the circuit board 50. Some of this heat is absorbed by the internal heat shield 46 and then transmitted via conduction through the contact portions 48 to the internal wall 40 and then to the outer walls 38 of the housing 36. This heat transfer out of the housing 36 via the heat shield 46, in conjunction with the gap 54, helps reduce the heat absorbed by the circuit board 50 and electronic devices 56. In a particular use of this invention on a specific vehicle, the temperatures of the electronic devices 56 on the printed circuit board 50 under a particular operating condition were seven to nineteen degrees Celsius cooler with the internal heat shield 46 than without it. This may allow for solder used on the board and the electronic devices 56 used to have a lower thermal rating, which reduces the cost of the solder and devices 56, without a concern that the devices may reach an upper temperature limit and prematurely shut off the cabin coolant heater.

While certain embodiments of the present invention have been described in detail, those familiar with the art to which this invention relates will recognize various alternative designs and embodiments for practicing the invention as defined by the following claims.

What is claimed is:

1. A heating circuit and an electronics assembly for use in a vehicle comprising:
   an external housing having outer walls and an internal wall dividing the external housing into an electronics cavity and a non-electronics cavity;
   a heat generating electronics assembly located in the electronics cavity adjacent to the internal wall;
   a control electronics assembly located in the electronics cavity adjacent to the heat generating electronics assembly, the control electronics portion configured to control the heat generating electronics assembly; and
   an internal heat shield extending between and shielding the control electronics assembly from the heat generating electronics assembly, the internal heat shield being made of a thermally conductive material and having a contact portion attached to at least one of the internal wall and the outer walls, whereby heat absorbed by the internal heat shield from the heat generating electronics assembly is transmitted to at least one of the internal wall and the outer walls.

2. The heating circuit and electronics assembly of claim 1 wherein the non-electronics assembly is a fluid flow channel configured to direct a flow of fluid past the heat generating electronics assembly.

3. The heating circuit and electronics assembly of claim 2 wherein the heat generating electronics assembly is a cabin coolant heater and is configured to selectively heat a coolant flowing through the fluid flow channel.

4. The heating circuit and electronics assembly of claim 3 including a heater core that is in fluid engagement with the fluid flow channel, wherein the coolant heated in the fluid flow channel is directed through the heater core.

5. The heating circuit and electronics assembly of claim 1 wherein the heat generating electronics assembly is a cabin coolant heater and is configured to selectively heat a coolant flowing through the non-electronics cavity.

6. The heating circuit and electronics assembly of claim 1 including a heater core that is in fluid engagement with the non-electronics cavity, wherein the fluid heated in the non-electronics cavity is directed through the heater core.

7. The heating circuit and electronics assembly of claim 1 wherein the thermally conductive material of the internal heat shield is aluminum.

8. The heating circuit and electronics assembly of claim 1 wherein the control electronics assembly includes a circuit board that is mounted spaced from the internal heat shield to create a gap.

9. The heating circuit and electronics assembly of claim 1 including a heat exchanger that is in fluid engagement with the non-electronics cavity, wherein a fluid heated in the non-electronics cavity is directed through the heat exchanger.

10. A method of operating a heating circuit and electronics assembly in a vehicle, the method comprising the steps of:
   (a) providing an external housing having outer walls and an internal wall dividing the external housing into an electronics cavity and a fluid flow channel;
   (b) directing a fluid through the fluid flow channel;
   (c) controlling a cabin coolant heater, located in the electronics cavity, with a control electronics assembly, located in the electronics cavity adjacent to the cabin coolant heater, to cause heat transfer from the cabin coolant heater to the fluid flowing through the fluid flow channel;
   (d) absorbing heat from the cabin coolant heater into a thermally conductive internal heat shield located between the cabin coolant heater and the control electronics assembly; and
   (e) transferring heat from the internal heat shield to at least one of the outer walls and the internal wall.

11. The method of claim 10 wherein step (b) is further defined by the fluid being a liquid coolant, and directing the coolant flowing through the fluid flow channel through a heater core of a HVAC system.

12. The method of claim 10 wherein step (d) and (e) are further defined by the internal heat shield being made of aluminum, and transferring heat from the cabin coolant heater to the aluminum and then to the internal wall.

* * * * *